United States Patent [19]

Morita et al.

[11] Patent Number: 4,810,525
[45] Date of Patent: Mar. 7, 1989

[54] LASER METHOD OF COATING METAL WITH A NOBLE METAL

[75] Inventors: Takeshi Morita; Seigo Hiramoto; Megumi Ohmine, all of Hyogo, Japan

[73] Assignee: Mitsubishi Denki Kabushiki Kaisha, Tokyo, Japan

[21] Appl. No.: 40,672

[22] Filed: Apr. 21, 1987

[30] Foreign Application Priority Data

Apr. 22, 1986 [JP] Japan ................... 61-95120

[51] Int. Cl.$^4$ ................... B05D 3/06; B05D 5/12
[52] U.S. Cl. ................... 427/53.1; 427/125
[58] Field of Search ................... 427/53.1, 125

[56] References Cited

U.S. PATENT DOCUMENTS

| | | | |
|---|---|---|---|
| 2,461,878 | 2/1949 | Christensen et al. | 427/125 |
| 4,181,757 | 1/1980 | Youdelis | 427/229 |
| 4,269,868 | 5/1981 | Livsey | 427/53.1 |
| 4,612,208 | 9/1986 | Reichenecker | 427/53.1 |
| 4,644,127 | 2/1987 | La Rocca | 427/53.1 |

Primary Examiner—Shrive Beck
Assistant Examiner—Marianne L. Padgett
Attorney, Agent, or Firm—Sughrue, Mion, Zinn, Macpeak, and Seas

[57] ABSTRACT

A noble metal coating method of coating an underlying metal with a noble metal comprises the steps of feeding a mixture comprising the noble metal, an oxide film removing agent, such as borax, and a binder for binding the metal and the agent to each other to a portion of the underlying metal that is to be coated and irradiating a laser beam onto the mixture on the underlying metal.

3 Claims, 2 Drawing Sheets

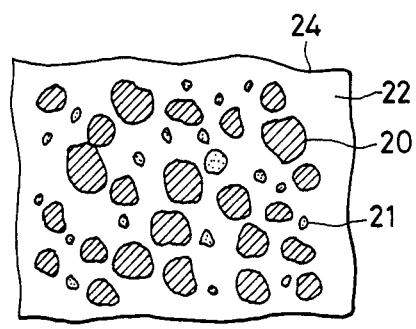
FIG. 2
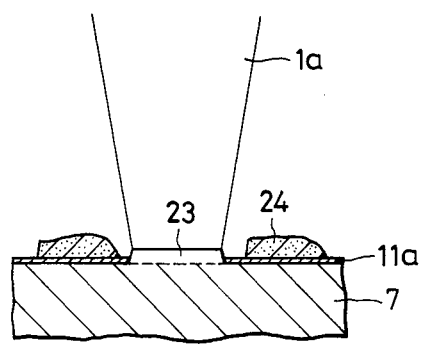
FIG. 3
FIG. 5 PRIOR ART
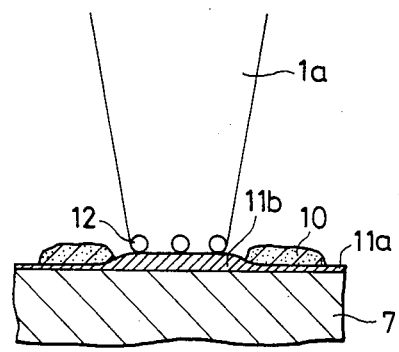

LASER METHOD OF COATING METAL WITH A NOBLE METAL

BACKGROUND OF THE INVENTION

The present invention relates to a method of coating a contactor of a circuit breaker or the like with a noble metal and particularly relates to the improvement of the process of applying the coating.

The contactor of a conventional circuit breaker is made of a copper member plated with silver not by a laser beam but by wet plating.

A method of coating with a metal other than a noble metal by a laser beam is disclosed in Japanese Patent Application Laid-Open No. 57-155363. FIG. 4 shows a device for coating with a metal by using this method. FIG. 4 indicates a laser oscillator 1, bending mirrors 2a, 2b and 2c which change the direction of a laser beam 1a emitted from the laser oscillator and constitute an optical system for transmitting the laser beam, a condensation lens 3 for condensing the laser beam, a powder feed means 4 for feeding a powder of the coating metal, a powder feeding pipe 5 for conveying the powder, a nozzle 6 for jetting the powder onto an underlying metal 7, a coating metal powder 8 jetted from the nozzle 6, a metal film 9 coated on the underlying metal 7, an arrow A indicating the travelling direction of the laser beam, and another arrow B indicating the travelling direction of the underlying metal.

The conventional device for coating the underlying metal 7 with the metal film 9 is constructed as described above. The laser beam 1a emitted from the laser oscillator 1 is transmitted by the bending mirrors 2a, 2b and 2c as shown by the arrow A. At the same time, the underlying metal 7 is moved as shown by the arrow B, and the coating metal powder 8 is fed from the nozzle onto the underlying metal 7. The laser beam 1a condensed to an appropriate diameter by the condensation lens 3 is irradiated upon the coating metal powder 8 so as to be absorbed by the powder and the surface layer of the underlying metal 7 to melt them to metallically bond them to each other. The underlying metal 7 is thus coated with the metal film 9.

Usually, the underlying metal 7 is an iron alloy and the coating metal 8 is nickel, chromium or an alloy thereof in the above-mentioned conventional method. In such a case, it is relatively easy to make a metal film 9 having good properties.

When an underlying metal made of a material such as a copper or an aluminum alloy is coated with a noble metal such as gold or silver, some differences exist as compared with the above-mentioned case in that the underlying metal is more likely to be oxidized, the laser beam absorption ratio of copper, silver and gold is much lower than that of iron and the like, and the thermal conductivity of the underlying metal is high.

FIG. 5 shows a sectional view of a noble-metal-coated portion in which an underlying metal 7 such as copper and an aluminum alloy is coated with a noble metal such as gold or silver in accordance with the above-described conventional method. As shown in FIG. 5, the laser-beam-irradiated portion has an oxide film 11b harder and thicker than that of a portion 11a surrounding the laser-beam-irradiated portion. Since the thermal conductivity of the underlying metal 7 is high and the laser beam absorption ratio of the noble metal is low, the temperature of the surface layer of the underlying metal 7 does not easily reach a bonding temperature and the powder of the noble metal on the laser-beam-irradiated portion is molten and condensed to make separate particle-like materials 12 so that the noble metal does not become a uniformly coated film.

SUMMARY OF THE INVENTION

The present invention was made in order to solve the above-mentioned problem. Accordingly, it is an object of the present invention to provide a method of uniformly coating an underlying metal with a noble metal.

In the method, a mixture comprising the noble metal, an oxide film-removing agent and a binder for binding the agent and the noble metal to each other is fed to a portion of the underlying metal to be coated, and the mixture on the underlying metal is irradiated with a laser beam to coat the underlying metal with the noble metal.

The oxide film removing agent in the mixture acts to prevent the portion of the underlying metal to be coated from being oxidized at the time of the irradiation with the laser beam and to clean the surface of the portion to be coated. The agent also acts to efficiently absorb the energy of the laser beam to promote the rise in the temperature of the mixture and the surface of the underlying metal.

BRIEF DESCRIPTION OF THE DRAWINGS

FIG. 2 is a view showing the state of a mixture;

FIG. 3 is a sectional view showing a noble-metal-coated portion upon which a laser beam is being irradiated according to the present invention;

FIG. 5 is a sectional view showing a portion in which a member of copper or the like is coated with a noble metal according to a conventional metal coating method.

DETAILED DESCRIPTION OF THE PREFERRED EMBODIMENTS

Figure 1A:
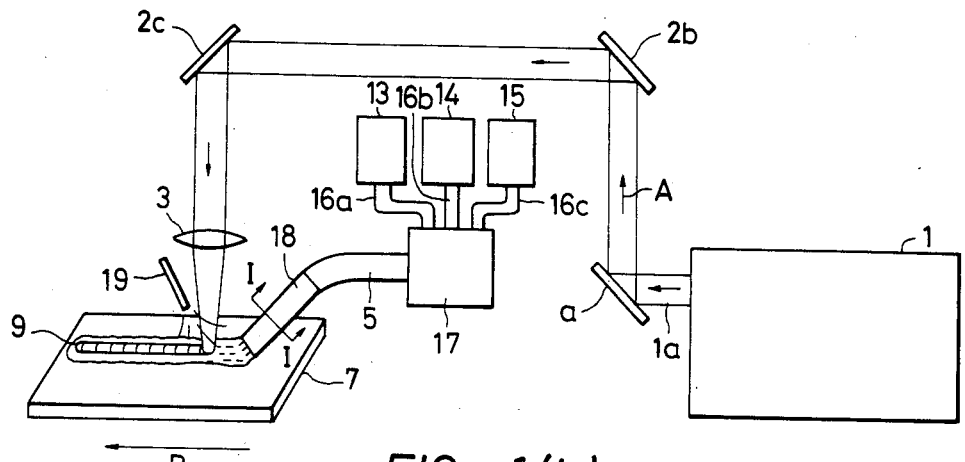
FIG. 1(a) is a schematic view showing a noble metal coating device in which a noble metal coating method according to the embodiment of the present invention is used.
Figure 1B:
FIG. 1(b) is a sectional view taken along a line I—I shown in FIG. 1(a)

FIG. 1(a) is a schematic view showing a noble metal coating device in which a noble metal coating method according to an embodiment of the present invention is used. FIG. 1(b) is a sectional view taken along a line I—I shown in FIG. 1(a).

Figure 4:
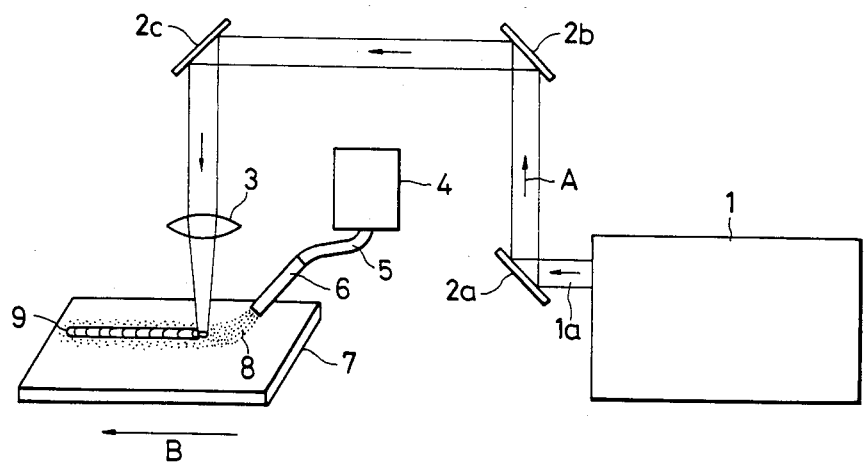
FIG. 4 is schematic view showing a conventional device for metal coating.

Reference numerals 1-5 shown in the drawings denote portions of the device which are the same as or equivalent to those of a conventional device shown by FIG. 4. FIG. 1(a) shows an underlying metal 7 which is copper or the like, a film 9 of a noble metal, a container 13 containing a powder of the noble metal such as silver, a container 14 containing an oxide film-removing agent such as borax which is a kind of borate, a container 15 containing a liquid such as water and ethyl alcohol, which is a binder for binding the noble metal and the oxide film removing agent to each other, pipes 16a, 16b and 16c through which the noble metal, the oxide film-removing agent and the binder are conveyed, a mixing feeder 17 for mixing the noble metal, the oxide film removing agent and the binder together and feeding the mixture, a mixture feed pipe 18 whose cross-sectional form is rectangular as shown in FIG. 1(b), and a shielding pipe 19 for shielding a laser-beam-irradiated portion from the surrounding air with an inert gas.

The noble metal, the oxide film removing agent and the binder are conveyed from the containers 13, 14 and 15 to the mixing feeder 17 through the pipes 16a, 16b and 16c and mixed together by stirring or the like in the mixing feeder to make a mixture.

FIG. 2 shows an example of the state of the mixture 24 comprising the powdered noble metal 20, the oxide film removing agent 21 and the binder 22 for binding them to each other. The mixture 24 may have a viscosity. The mixture 24 made by the mixing feeder 17 is fed to the portion of the underlying metal 7 to be coated through the feed pipe 5 and the nozzle of the mixture feed pipe 18. Since the cross-sectional form of the mixture feed pipe 18 is rectangular, the mixture is fed with a uniform thickness to the portion of the metal to be coated.

A laser beam 1a, transmitted in a direction A and condensed by a condensation lens 3, is irradiated upon the mixture 24 on the underlying metal 7 to make the mixture molten while the underlying metal is moved in a direction B. At that time, the output of the laser beam is, for example, 2.5 kW and the speed of coating is 80 cm/min.

FIG. 3 is a sectional view showing the metal portion to be coated upon which the laser beam 1a is irradiating. Since the oxide film removing agent 21 in the molten mixture 24 acts to remove any oxide film from the underlying metal 7, oxide film 11a is left only where the laser beam 1a has not been irradiated. The oxide film-removing agent 21 also acts to prevent an oxide film from being produced on the underlying metal 7 after the irradiation of the laser beam 1a. For that reason, the noble metal 20 in the molten mixture 24 and the underlying metal 7 are metallically bonded to each other, almost without melting the surface of the underlying metal, so that a uniform noble metal film 23 can be formed.

The noble metal 20 is powdered silver whose grain diameter is about 50 $\mu$m in the embodiment and should preferably be limited within a range of from 2 $\mu$m to 50 $\mu$m. If the grain diameter is less than 2 $\mu$m, it is likely that the noble metal particles will gather together so as to become difficult to bond to the underlying metal 7. If the grain diameter is more than 50 $\mu$m, the noble metal is more likely to reflect the laser beam 1a so as to become difficult to melt. These undesirable phenomena were experimentally proven to occur.

The weight ratio of the noble metal 20 to the mixture 24 is 60% in the embodiment and should preferably be limited within a range from about 30% to about 80%. If the weight ratio is less than 30%, the film 23 of the noble metal is likely to become discontinuous. If the weight ratio is more than 80%, it is likely that the noble metal particles will gather together and the film surface will become nonuniform.

The weight ratio of the oxide film removing agent 21 to the mixture 24 is 30% in the embodiment and should preferably be limited within a range from about 10% to about 50%. If the weight ratio is less than 10%, the agent 21 cannot be expected to act well to remove the oxide film, and the film 23 of the noble metal is likely to separate from the underlying metal 7. If the weight ratio is more than 50%, the oxide film removing agent 21 is likely to remain in the film 23 of the noble metal and thereby deteriorate the corrosion-resisting property of the film.

The above-mentioned weight ratios should be appropriately determined depending on the state of the surface of the underlying metal 7 and the thickness of the film 23 of the noble metal.

Although the underlying metal 7 is copper or the like in the embodiment, the underlying metal may be an easily-oxidizable material such as an aluminum alloy.

The oxide film removing agent 21 is not confined to borax but may be anything such as a material containing boric acid, a borate or a fluoride as the main constituent of the material if it is capable of removing the oxide film.

The binder 22 is not confined to water and ethyl alcohol but may be anything such as an organic solvent if it is capable of binding the noble metal and the oxide film-removing agent to each other.

In the embodiment, although the laser beam 1a is irradiated upon the mixture 24 while the mixture is being fed to the underlying metal 7, the mixture 24 can also be applied to the underlying metal 7 prior to irradiating the mixture with the laser beam.

As described above, according to the noble metal coating method of the present invention, a mixture of a noble metal, an oxide film removing agent and a binder for binding them is fed to a portion of an underlying metal to be coated, while a laser beam is irradiated upon the mixture to coat the underlying metal with the noble metal. Accordingly, oxidation of the portion of the underlying metal to be coated can be prevented and a uniform film of the noble metal can be formed.

What is claimed is:

1. A method of coating an underlying metal with a noble metal comprising the steps of:
   (1) feeding a mixture comprising said noble metal, an oxide film-removing agent and a binder for binding said metal and said agent to each other, to a portion of said underlying metal to be coated, wherein:
      (a) said noble metal is a powder having a grain diameter of 2 to 50 $\mu$m.
      (b) the weight ratio of said noble metal to said mixture is from about 30 to about 80%.
      (c) the weight ratio of said oxide film-removing agent to said mixture is from about 10 to about 50%.
      (d) said oxide film-removing agent is borax, and
      (e) said binder is a material selected from the group consisting of water and ethyl alcohol; and
   (2) irradiating said mixture on said underlying metal with a laser beam.

2. A method according to claim 1, wherein said noble metal is silver.

3. A method according to claim 1, further comprising the step of flowing an inert gas from a shielding pipe onto said mixture being irradiated by said laser beam.

* * * * *